United States Patent [19]

Mueller et al.

[11] Patent Number: 5,230,459
[45] Date of Patent: Jul. 27, 1993

[54] METHOD OF BONDING A SPUTTER TARGET-BACKING PLATE ASSEMBLY ASSEMBLIES PRODUCED THEREBY

[75] Inventors: John J. Mueller, Hilliard; David E. Stellrecht, Columbus, both of Ohio

[73] Assignee: Tosoh SMD, Inc., Grove City, Ohio

[21] Appl. No.: 853,095

[22] Filed: Mar. 18, 1992

[51] Int. Cl.$^5$ .................. C23C 14/34; B23K 31/00
[52] U.S. Cl. .................. 228/164; 228/263.11; 228/174; 228/265; 204/298.12; 204/298.13
[58] Field of Search .................. 228/122, 124, 263.12, 228/164, 174, 265; 204/298.12, 298.13

[56] References Cited

U.S. PATENT DOCUMENTS

| | | | |
|---|---|---|---|
| 4,468,313 | 8/1984 | Okumura et al. | 204/298 |
| 4,610,774 | 9/1986 | Sakata et al. | 204/298 |
| 4,752,335 | 6/1988 | Korb | 75/249 |
| 4,820,397 | 4/1989 | Fielder et al. | 204/298 |
| 4,826,584 | 5/1989 | Ribeiro | 204/298 |
| 5,009,765 | 4/1991 | Qamar et al. | 204/298.12 |
| 5,066,381 | 11/1991 | Ohta et al. | 204/298.12 |

Primary Examiner—Samuel M. Heinrich
Attorney, Agent, or Firm—Biebel & French

[57] ABSTRACT

Methods of preparing a sputter target/backing plate assembly and assemblies so prepared are disclosed. The methods comprise forming a plurality of grooves in one of the metal surfaces to be joined in the bonding process. The grooves are each provided in a closed, loop configuration or pattern. The target and backing plate to be bonded are adjacently positioned to form an assembly with the grooved surface forming one of the interfacial joint surfaces. The assembly is then placed in a controlled atmosphere, such as a vacuum, heated to a temperature just below the melting point of the lower melting metal to be joined, and pressed until the grooves are substantially filled with metal or alloy from the other, non-grooved interfacial surface.

16 Claims, 2 Drawing Sheets

METHOD OF BONDING A SPUTTER TARGET-BACKING PLATE ASSEMBLY ASSEMBLIES PRODUCED THEREBY

FIELD OF THE INVENTION

The invention pertains to a method of bonding together components of a sputter target-backing plate assembly and to target-backing plate assemblies so produced.

BACKGROUND OF THE INVENTION

Cathodic sputtering is widely used for the deposition of thin layers of material onto desired substrates. Basically, this process requires a gas ion bombardment of the target having a face formed of a desired material that is to be deposited as a thin film or layer on a substrate. Ion bombardment of the target not only causes atoms or molecules of the target material to be sputtered, but imparts considerable thermal energy to the target. This heat is dissipated by use of a cooling fluid typically circulated beneath or around a backing plate that is positioned in heat exchange relation with the target.

The target forms a part of a cathode assembly which together with an anode is placed in an evacuated chamber that contains an inert gas, preferably argon. A high voltage electrical field is applied across the cathode and anode. The inert gas is ionized by collision with the electrons ejected from the cathode. Positively charged gas ions are attracted to the cathode and, upon impingement with the target surface, dislodge the target material. The dislodged target materials traverse the evacuated enclosure and deposit as a thin film on the desired substrate that is normally located proximate the anode.

In addition to the use of an electrical field, increasing sputtering rates have been achieved by the concurrent use of an arch-shaped magnetic field that is superimposed over the electrical field and formed in a closed loop configuration over the surface of the target. These methods are known as magnetron sputtering methods. The arch-shaped magnetic field traps electrons in an annular region adjacent the target surface thereby increasing the number of electron-gas atom collisions in the area to produce an increase in the number of positively charged gas ions in the region that strike the target to dislodge the target material. Accordingly, the target material becomes eroded (i.e., consumed for subsequent deposition on the substrate) in a generally annular section of the target face, known as the target raceway.

In conventional target cathode assemblies, the target is attached to a nonmagnetic backing plate. The backing plate is normally water-cooled to carry away the heat generated by the ion bombardment of the target. Magnets are typically arranged beneath the backing plate in well-known dispositions in order to form the above-noted magnetic field in the form of a loop or tunnel extending around the exposed face of the target.

In order to achieve good thermal and electrical contact between the target and the backing plate, these members are commonly attached to each other by use of soldering, brazing, diffusion bonding, clamping, epoxy cements, etc.

To a certain extent, soft solders can accommodate stresses exerted on the target/backing plate assembly that occur upon cooling. These stresses can be considerable in light of the significant differences in thermal expansion coefficients that may exist between the target and backing plate metals. However, the relatively low joining temperatures associated with the "soft" solders reduce the temperature range over which the target can be operated during sputtering.

In some cases, in order to overcome the problem of joining one or more non-wettable materials by soldering, precoating with a metal is used to enhance solderability. These coatings may be applied by electroplating, sputtering or other convenient methods.

Another method which is applicable and used to some extent in target joining is that of explosive bonding or welding. By this technique, bonds are produced that combine solid state bonding and a mechanical interlocking as a result of the surface irregularities produced in the form of "jetting." The bonds are strong and reliable. The disruption of the initial mating surfaces during the dynamic bonding pulse negates the need for extreme surface cleanliness or preparation.

Diffusion bonding is an applicable method of bonding but has had only limited use in the bonding of sputtering target components. The bond is produced by pressing the material surfaces into intimate contact while applying heat to induce metallurgical joining and diffusion to varying extent across the bond interface. Bonding aids, metal combinations which are more readily joined, are sometimes applied to one or both of the surfaces to be bonded. Such coatings may be applied by electroplating, electroless plating, sputtering, vapor deposition or other usable technique for depositing an adherent metallic film. It is also possible to incorporate a metallic foil between bonding members which foil has the ability to be more easily bonded to either of the materials to be joined. The surfaces to be joined are prepared by chemical or other means to remove oxides or their films which interfere with bonding.

Solder bonds of materials with widely differing thermal expansion rates are susceptible to shear failure initiating at the extreme edges of the bond interface when the solder is too weak for the application. The result commonly experienced is debonding during service. The need for intermediate coatings applied to materials that are difficult to wet and solder presents two problems, 1) adherence reliability of the applied coating and 2) substantial added cost of applying the coating. The higher melting temperature solders used for high power applications are stronger but are less forgiving of the stresses developed in the material system. Targets of large size present greater stress problems as well as greater difficulty of producing sound bonds across the entire bond surface. As sputtering target sizes and power requirements increase, the soft solders become less applicable for joining of the material systems involved.

Explosive bonding is a comparatively costly bonding method. Such bonding requires that the materials to be joined are provided in an oversize condition, allowing for predictable damage at the periphery of the target assembly, thereby adding material cost. Each size of component assembly and combination of materials requires development of the conditions for achieving acceptable products. Although the bonds offer good strength the bond interfaces are variable in physical character. This method is not applicable to a material system which has one component which is brittle or has limited ductility.

Diffusion bonds require extreme care in preparation and in maintaining surface cleanliness prior to and during the bonding operation to ensure reliable bond qualities. The diffusion bond interfaces being planar are subject to stressing in simple shear which commonly leads to peeling away at the ends of the bond area. The formation of brittle metallics at the bond interface, which increase in thickness with the associated long times of heat exposure, add to the potential of bond shear failure.

Accordingly, it is an object of the invention to provide a convenient, inexpensive method for bonding target and backing plate materials that will be capable of withstanding thermal expansion and contraction stresses exerted thereon during and after sputtering.

SUMMARY OF THE INVENTION

These and other objects are met by the target/backing plate bonding method of the invention that includes the pre-bonding step of providing machined grooves in the surface of one of the components to be solid state bonded. This feature causes disruption of the bond surface of the associated component during heated pressure application. The material having the greater strength or hardness will normally be provided with the grooves such that, during bonding, it will penetrate into the softer member with the softer metal substantially filling the grooves.

The interfacial deformation involved causes disruption of any bond inhibiting film on the smooth surfaced member and smearing of the grooved surface. This results in cleaning of the grooved surface and initiated welding together of the components by a galling action, such as in cold welding.

The grooved or saw-tooth pattern of the bond interface adds significantly to the resistance of the bonded assembly to failure by shear. The greater the differential in thermal expansion coefficients between target and backing plate, the greater the shear stresses produced. The strength and resistance to shear failure offered by the saw-tooth pattern allow for the use of higher operational sputtering temperatures and extend the range of target sizes achievable without compromising structural reliability.

The invention will be further described in the appended drawings and detailed description.

DETAILED DESCRIPTION OF THE PREFERRED EMBODIMENT

Figure 1:
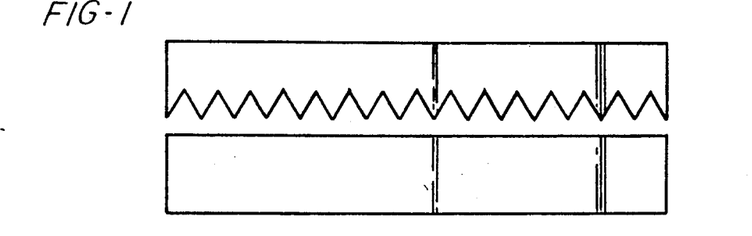
FIG. 1 is a cross-sectional view of a target and backing plate prior to assembly and bonding.

Turning first to FIG. 1, there is shown target 2 and backing plate 10 prior to bonding. Target 2 includes upper face surface 4 which, in accordance with sputtering technique, will be bombarded with excited inert gas ions during sputtering, dislodging material from surface 4 for ejection therefrom and onto a substrate located proximate the anode (not shown). Together, target 2 and backing plate 10 are part of the cathode of the sputtering assembly.

Bottom surface 6 of the target is provided with a plurality of saw-tooth shaped grooves 8 which may be machined in the surface in accordance with well-known techniques. Bottom surface 6 is adapted for mating with top surface 12 of backing plate 10. Normally, the backing plate is composed of a high thermal conductivity metal, such as copper or aluminum. In most operations, a cooling medium (not shown) is circulated in heat exchange relation with bottom surface 14 of backing plate 10 to transfer heat from the target 2 that results from sputtering operation.

Figure 2:
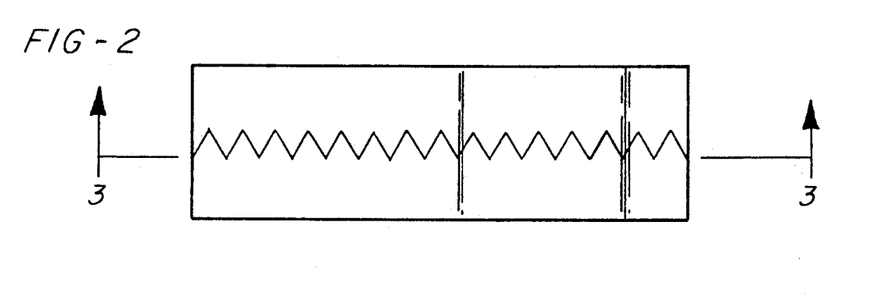
FIG. 2 is a cross-sectional view of a bonded target and backing plate assembly in accordance with the invention.

As per FIG. 2, the grooved surface 6 of target 2 is superposed on top of mating top surface of backing plate 12. The, under controlled atmosphere conditions, the so assembled target/backing plate structure is heated and pressed until the material from backing plate 10 substantially fills the grooves which define the sawtooth pattern to effect bonding of the target and backing plate.

As to the controlled atmosphere, this is most preferably a vacuum but the bonding operation could also be conducted under an inert gas atmosphere or under reducing conditions such as under a nitrogen blanket. The important factor is that oxygen must be excluded from the bonding operation. Otherwise, component metal oxide films could form that would adversely affect bond strength and performance.

The target/backing plate assembly is to be heated either prior to or concurrently with the pressing step. In accordance with solid state bonding methods, these temperatures will be chosen so as to be just below the melting point of the lower melting component of the target-backing plate combination.

Preferably, the target/backing plate assembly is placed in a protective envelope, such as supplied by a stationary hard shell furnace or by encapsulating the assembly in a thin metal container. When the container approach is used, it can be evacuated through a tube or the like that is provided in the container. When a furnace is used, the atmosphere is controlled as stated supra., so that, preferably, a vacuum exists therein.

Pressure applied during the bonding operation may vary over a wide range. The pressure and time required for pressing are controlled so that a strong bond can be formed. Of primary importance is the fact that the grooved component should penetrate into the softer, non-grooved component so that the saw-toothed shaped grooves are substantially filled with this softer metal component. Pressure may vary from 2,000–15,000 psi depending on process conditions.

In accordance with the presently preferred method, a titanium target is diffusion bonded to an aluminum backing plate. A plurality of concentric grooves having a depth of 1/16" are machined in the bottom surface 6 of the titanium target. The target/backing plate assembly is positioned as shown in FIG. 2 and placed in a steel container that is then evacuated to vacuum condition. The assembly is heated to about 550°–625° C. (i.e., just below the melting point of the backing plate). The assembly is pressed at about 10,000 psi until the saw-tooth grooves in the titanium target are filled with aluminum. As another way of assessing the pressing step, the aluminum in the steel can is compressed approximately ⅛", about twice the height dimension of the grooves.

In addition to the preferred bonding method, the assembly could also be placed in a HIP (hot isostatic pressing) can, and HIPed at a temperature of about 600° C. or less under HIPing pressures of about 15,000 psi. This is not preferred however due to its expensive nature.

Another alternative approach is to place a preheated target/backing plate assembly in a vacuum chamber and then press the assembly in an open platen type press or the like until adequate coalescence of the interfaces in accordance with the parameters mentioned above occurs.

Figure 3:
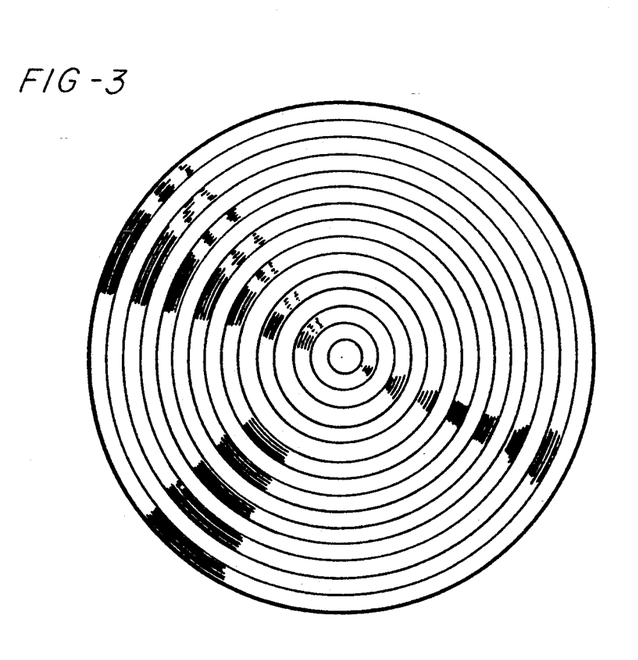
FIG. 3 is a cross-sectional view taken along the lines and arrows 3—3 of FIG. 2.

Turning now to FIG. 3, there is shown underneath side 6 of target 2. A plurality of concentric grooves 8 are provided which, as per the above, are machined into the surface prior to bonding. Although concentric grooves are shown and are preferred, other closed-looped configurations including triangles, squares, rectangles, and ovals may also be used. The point is that the grooves or loops should be closed so that any oxygen trapped in the metal surface will be impeded from migrating out of the surface during the sputtering operation. Such migration would contaminate the sputtering chamber and could lead to the formation of impurities on the sputter-coated substrate.

In addition to use in conjunction with titanium target/aluminum backing plate assemblies, the invention is applicable to a host of other target/backing plate compositions. For example, a molybdenum target/copper backing plate assembly can be solid state bonded in accordance with the invention. In this case, the bottom side of the molybdenum target is grooved and the assembly would be heated to just below the melting point of the copper or copper alloy. In all of the possible target/backing plate combinations, the harder component is provided with the grooved, interfacial surface, and the heat applied, as per solid state bonding techniques, is controlled to temperatures below the melting point of the lower melting component.

Other target/backing plate assemblies that can be effectively bonded in accordance with the invention include precious metal targets in combination with copper backing plates. The precious metals include Ru, Rh, Pd, Ag, Os, Ir, Pt and gold.

Figure 4:
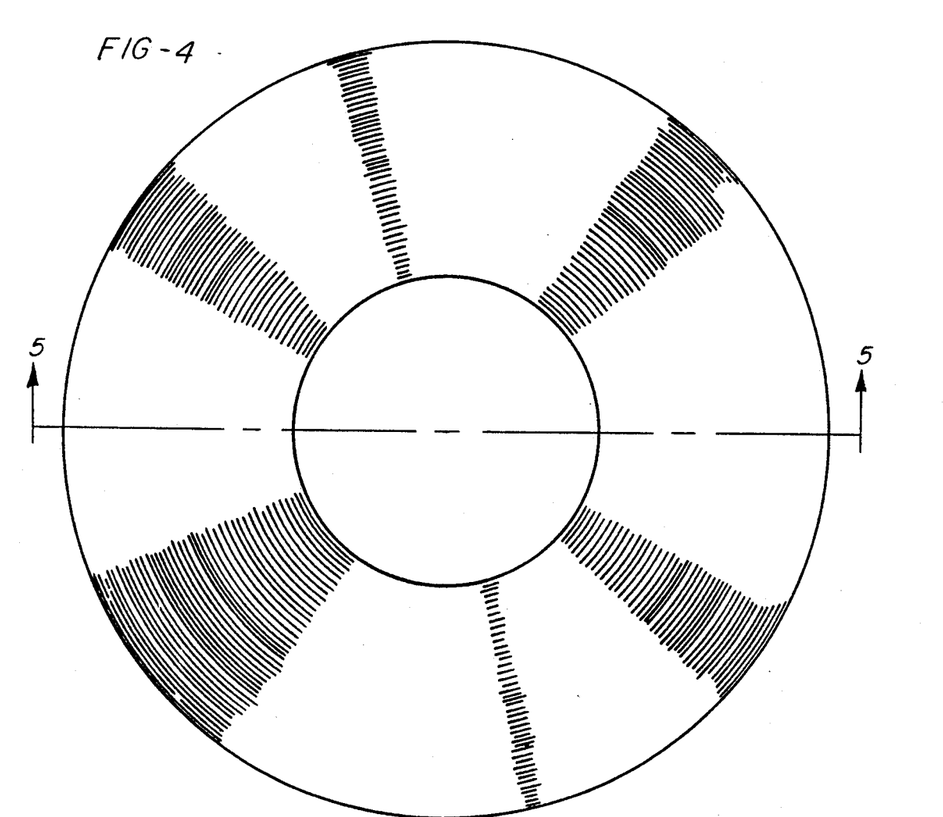
FIG. 4 is a top plan view of another embodiment of the invention illustrating a circular, concave face target/backing plate assembly.
Figure 5:
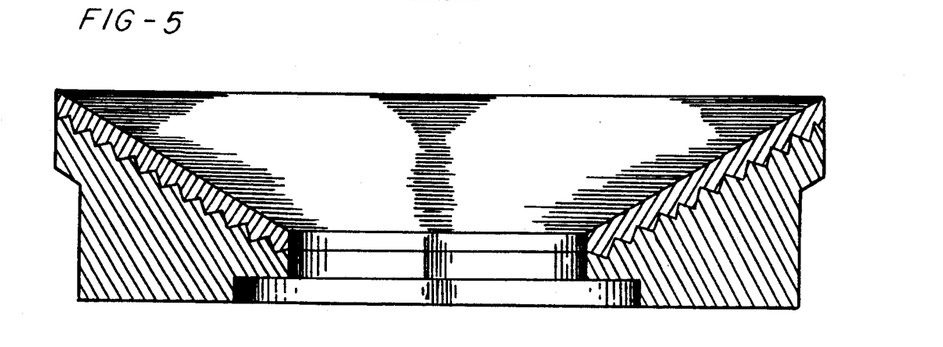
FIG. 5 is a sectional view taken along the lines and arrows 5—5 of FIG. 4.

Although the preferred embodiment depicted in FIGS. 1-3 illustrates a circular, planar surface target 2, FIGS. 4 and 5 illustrate that the inventive techniques can also be used to provide a concave face 16 target over a corresponding backing structure. Again, a saw-toothed shaped grooved pattern is provided in the bottom side 6 of the target that is solid state bonded to surface 12 of the associated backing plate.

The invention provides improvement over the use of soft solder bonds in that it can be used over a wider range of sputtering power levels and target operating temperatures without fear of bond melt failures. Additionally, large targets can be bonded with less concern for shear failures along the bonded interface.

The bonds produced by this invention are less costly to develop or produce than by explosive bonding. In the case of HIP bonding, a number of target assemblies can be pressed simultaneously. In press bonding, several assemblies can be furnace heated at one time and each pressed in fairly rapid succession. The mechanical features of the bond interface are more regular and predictable than the "jetting"-type interface features produced in an explosive operation. The bonding operation by this invention reduces the amount of initial oversize condition and amount of post bonding stock removal in the machining operations.

Conventional diffusion bonding necessitates high quality surface cleaning and surface maintenance before and through the bonding operation. The components associated with this invention are less sensitive to surface films or contamination because of the significant degree of mechanical surface disruption occurring during pressure contacting of the components. This type of surface disruption reduces the time and temperature of pressing and, depending on the specific materials involved, yields a solid state bond with little if any interdiffusion of the components.

An important feature of this invention is the use of a closed, grooved or notedly irregular surface of one component which enhances bonding as a result of the disruption of the mating smooth-faced component. In addition, the resulting bond interface feature provides an enhancement of the resistance of the bonded assembly to shear caused by a difference in thermal expansion characteristics and the change in temperature from bonding level to ambient.

While the method described herein and the target/backing plate assemblies produced in accordance with the method have been described with certain specific forms and certain modifications thereof, it will be appreciated that a wide variety of other modifications can be made without departing from the scope and spirit of this invention as defined in the appended claims. It is also to be kept in mind that reference to a metal or metal component herein also includes reference to alloyed forms of the stated metal.

What is claimed is:

1. In a method of preparing a bonded sputter target/backing plate assembly comprising a target composed of a first metal or alloy to be sputtered and an underlying backing plate member composed of a second metal or alloy, an improved method for joining said target and backing plate along mating surfaces thereof, comprising:

forming a plurality of grooves in one of said mating surfaces, positioning said target and backing plate adjacent each other to form an assembly having an interface defined by said mating surfaces;

subjecting said assembly to a controlled atmosphere selected from the group consisting of a vacuum, inert, or reducing conditions;

heating said assembly; and pressing said assembly so that said grooves are substantially filled with metal or alloy from the other of said mating surfaces.

2. Method as recited in claim 1 wherein said grooves comprise a plurality of closed loop configurations.

3. Method as recited in claim 2 wherein said grooves comprise a plurality of concentric circular grooves.

4. Method as recited in claim 1 wherein said controlled atmosphere is a vacuum.

5. Method as recited in claim 1 wherein said target comprises titanium or titanium alloy and said backing plate comprises aluminum or aluminum alloy.

6. Method as recited in claim 5 wherein said heating comprises heating said assembly to a temperature less than the melting point of said aluminum or aluminum alloy.

7. Method as recited in claim 6 wherein said heating comprises heating said assembly to about 550°-625° C.

8. Method as recited in claim 7 wherein said pressing comprises pressing said assembly at a pressure of about 2,000–15,000 psi.

9. Method as recited in claim 1 wherein said target comprises molybdenum or molybdenum alloy and said backing plate comprises copper or copper alloy.

10. Method as recited in claim 9 wherein said heating comprises heating said assembly to a temperature less than the melting point of said copper or copper alloy.

11. Method as recited in claim 1 wherein said target comprises a precious metal or precious metal alloy, said precious metal being chosen from the group consisting of Ru, Rh, Pd, Ag, Os, Ir, Pt and Au.

12. Method as recited in claim 11 wherein said backing plate comprises copper or copper alloy.

13. Assembly made in accordance with claim 1.
14. Assembly made in accordance with claim 5.
15. Assembly made in accordance with claim 9.
16. Assembly made in accordance with claim 11.

* * * * *

UNITED STATES PATENT AND TRADEMARK OFFICE
CERTIFICATE OF CORRECTION

PATENT NO. : 5,230,459

DATED : July 27, 1993

INVENTOR(S) : John J. Mueller and David E. Stellrecht

It is certified that error appears in the above-identified patent and that said Letters Patent is hereby corrected as shown below:

The title page showing the illustrative figure should be deleted and be replaced with the attached title page, drawings sheets 1 and 2 should be deleted and substitute therefor the attached sheets.

Signed and Sealed this

Eleventh Day of February, 1997

Attest:

BRUCE LEHMAN

*Attesting Officer*       *Commissioner of Patents and Trademarks*

United States Patent [19]

Mueller et al.

[11] Patent Number: 5,230,459
[45] Date of Patent: Jul. 27, 1993

[54] METHOD OF BONDING A SPUTTER TARGET-BACKING PLATE ASSEMBLY ASSEMBLIES PRODUCED THEREBY

[75] Inventors: John J. Mueller, Hilliard; David E. Stellrecht, Columbus, both of Ohio

[73] Assignee: Tosoh SMD, Inc., Grove City, Ohio

[21] Appl. No.: 853,095

[22] Filed: Mar. 18, 1992

[51] Int. Cl.⁵ .................. C23C 14/34; B23K 31/00
[52] U.S. Cl. .................. 228/164; 228/263.11; 228/174; 228/265; 204/298.12; 204/298.13
[58] Field of Search .................. 228/122, 124, 263.12, 228/164, 174, 265; 204/298.12, 298.13

[56] References Cited

U.S. PATENT DOCUMENTS

| | | | |
|---|---|---|---|
| 4,468,313 | 8/1984 | Okumura et al. | 204/298 |
| 4,610,774 | 9/1986 | Sakata et al. | 204/298 |
| 4,752,335 | 6/1988 | Korb | 75/249 |
| 4,820,397 | 4/1989 | Fielder et al. | 204/298 |
| 4,826,584 | 5/1989 | Ribeiro | 204/298 |
| 5,009,765 | 4/1991 | Qamar et al. | 204/298.12 |
| 5,066,381 | 11/1991 | Ohta et al. | 204/298.12 |

Primary Examiner—Samuel M. Heinrich
Attorney, Agent, or Firm—Biebel & French

[57] ABSTRACT

Methods of preparing a sputter target/backing plate assembly and assemblies so prepared are disclosed. The methods comprise forming a plurality of grooves in one of the metal surfaces to be joined in the bonding process. The grooves are each provided in a closed, loop configuration or pattern. The target and backing plate to be bonded are adjacently positioned to form an assembly with the grooved surface forming one of the interfacial joint surfaces. The assembly is then placed in a controlled atmosphere, such as a vacuum, heated to a temperature just below the melting point of the lower melting metal to be joined, and pressed until the grooves are substantially filled with metal or alloy from the other, non-grooved interfacial surface.

16 Claims, 2 Drawing Sheets